United States Patent [19]

Haitz

[11] 3,780,357

[45] Dec. 18, 1973

[54] ELECTROLUMINESCENT SEMICONDUCTOR DISPLAY APPARATUS AND METHOD OF FABRICATING THE SAME

[75] Inventor: Roland H. Haitz, Portola Valley, Calif.

[73] Assignee: Hewlett-Packard Company, Palo Alto, Calif.

[22] Filed: Feb. 16, 1973

[21] Appl. No.: 333,431

[52] U.S. Cl...... 317/234 R, 317/235 N, 313/108 D, 317/235 AJ, 317/234 E, 29/582

[51] Int. Cl. ........................................ H05b 33/00

[58] Field of Search.................... 317/235 N, 235 R, 317/234 E; 313/108 D

[56] References Cited

UNITED STATES PATENTS

| | | | |
|---|---|---|---|
| 3,501,676 | 3/1970 | Adler | 315/169 |
| 3,739,217 | 6/1973 | Bergh | 313/108 R |
| 3,593,055 | 7/1971 | Geusie | 313/108 D |
| 3,699,407 | 10/1972 | Gurtter | 317/235 R |
| 3,636,358 | 1/1972 | Groschintz | 250/211 J |
| 3,703,670 | 11/1972 | Kunz | 317/235 R |
| 3,512,027 | 5/1970 | Kupsky | 313/108 |
| 3,668,404 | 6/1972 | Lehovec | 250/211 J |
| 3,537,028 | 10/1970 | Pankove | 331/94.5 |
| 3,476,942 | 11/1969 | Yanoi | 250/213 |
| 3,696,263 | 10/1972 | Wacher | 313/108 D |

*Primary Examiner*—Martin H. Edlow
*Attorney*—A. C. Smith

[57] ABSTRACT

This electroluminescent semiconductor display apparatus utilizes a light-emitting semiconductor device surrounded by a molded white plastic body and transparent material containing scattering centers for diffusing the light emitted from the semiconductor over a large area. The light-emitting device is placed on a base material and a white plastic body is positioned about the device to provide a corridor for light from the device to the upper surface of the body. This pathway is filled with transparent material containing scattering centers, e.g., a mixture of epoxy and glass powder. Light emitted from the device passes up through the corridor diffusely reflecting from the sides of the body and being scattered by the diffusion centers in the transparent material. Thus, at the upper surface of the body, the corridor appears as an essentially uniformly illuminated surface. In the above described manner, a very intense, nearly point source of light emitted from an electroluminescent semiconductor device is diffused to less intense, more uniform illumination over a much larger surface of a display apparatus, thereby obviating the need for large-area light-emitting devices.

10 Claims, 13 Drawing Figures

ELECTROLUMINESCENT SEMICONDUCTOR DISPLAY APPARATUS AND METHOD OF FABRICATING THE SAME

BACKGROUND OF THE INVENTION

This invention relates to electroluminescent semiconductor displays. Throughout this discussion the prior art in electroluminescent semiconductor displays will be divided into two groups, herein referred to as Category A and Category B. In Category A, as depicted by FIGS. 1A and 1B, the apparent size of the electroluminescent semiconductor device 12*a* is enhanced by placing it in a cavity 13*a* filled with transparent material 17*a* and having specularly reflecting walls 24*a*. These walls 24*a* are typically formed by metal deposits on some other material 16*a*. The electroluminescent semiconductor device 12*a* is placed on a substrate 18*a* in the center of the cavity and emits photons 30*a* isotropically into the transparent material 17*a*. The top surface 14*a* of the cavity 13*a* is illuminated by light coming directly from the device 12*a* or by specular reflection from the walls 24*a*. Roughening of the top surface 14*a* causes the light to refract randomly and thereby approximate a Lambertian distribution. To obtain uniform illumination at the upper surface 14*a* of the cavity 13*a*, however, it is important to achieve a reasonably uniform distribution of light at the location 15*a* where the light rays intersect the plastic-air interface 14*a* that produces the random refraction. To achieve such uniformity, that is, to increase the illumination in regions away from the light-emitting electroluminescent semiconductor device 12*a*, the cavity 13*a* with its specularly reflecting walls 24 *a*, must be properly shaped. A typical shape is shown in FIG. 1A in which a cross-section through the length of the cavity has been taken. FIG. 1B shows the cavity from a direction perpendicular to FIG. 1A. The specularly reflecting metalized end walls 24*a* (in FIG. 1A) of the cavity may approximate a parabola with straight line segments, or they may be parabolic curves. In either case, the electro-luminescent semiconductor device 12*a* is placed at the focal point of the parabola. Thus, light emitted from the sides of the device toward the end walls 24*a* as shown in FIG. 1A will be specularly reflected upwardly toward the roughened surface 14*a* near the ends of the cavity 13*a* rather than the center, thereby compensating for the reduced direct emission in the direction of the ends. Light emitted toward the vertical side walls 24*a* (as shown in FIG. 1B) may undergo several specular reflections before reaching the upper surface 14*a*. In addition to the constraint of approximately parabolically shaped end walls, the apparatus of Category A also require a device which emits light through its sides in an approximate isotropic emission pattern. Typically this type of emission pattern has been achieved by utilizing gallium phosphide semiconductor devices. In contrast, however, a gallium arsenide phosphide device which has Lambertian emission characteristics substantially from the upper surface emissions only, would not emit sufficient light toward the side and end walls to achieve the desired uniform illumination of the upper surface. Use of side-emitting electro-luminescent semiconductor devices, however, results in a large portion of the light emitted toward the side walls of the cavity undergoing multiple reflections before reaching the surface. With the metalization deposited on the walls having a reflective coefficient of approximately 90 percent for gold, aluminum, silver or copper, it is evident that the multiple reflections will strongly attenuate the light emitted from the sides of the device in the direction of the sides of the cavity before it reaches the upper surface. Thus, electroluminescent semiconductor display apparatus utilizing the design techniques of Category A appear to require or satisfy the following four criteria:

1. specularly reflecting walls;
2. sloped end walls, in particular the end walls must approximate a parabola with the light-emitting device placed at its focal point;
3. an isotropically emitting device, that is, a device with light emission through its sides. In practice, this requirement eliminates the use of gallium arsenide phosphide semiconductors because of their Lambertian emission characteristic;
4. a roughened or other non-flat surface forming the upper surface of the display apparatus to randomize the highly direct radiation into a nearly Lambertian distribution.

Requirement 1 constrains the side walls, i.e., those shown in FIG. 1B, to be vertical or outwardly sloping. That is, the corss-section at the top of the display must be equal to or wider than the cross-section at the bottom of the display. Inwardly sloped side walls, wherein the top is narrower than the bottom, could not be utilized in the prior art devices for the following reasons. As shown in FIG. 3A, specular reflection will not change the angle of incidence between the light ray and the wall in case of parallel vertical walls. In the case of inwardly sloped walls, however, (see FIG. 3B) the angle of incidence changes after each reflection. It can be seen that a light ray emitted at a 45° angle from the device will reverse its direction after some number of reflections and may never reach the top of the cavity. Realizing that half of the light emitted by a Lambertian device is emitted at an angle of more than 45° from the vertical, it becomes apparent that inwardly sloping walls should not be used in Category A designs. In some designs wherein the body of the display is to be fabricated by a molding process, the constraint of wall slope discussed above may be important.

The requirement of vertically or outwardly sloping side walls may have other consequences. First, the minimum width of the cavity at the top must be at least the device size plus twice the assembly tolerance, that is, a device chip 0.018 inches wide and an assembly tolerance of 0.006 inches requires a width of 0.030 inches. Such a width limitation is undesirable for two reasons. First, in order to maintain a visually pleasing ratio of character height to segment width the apparatus is limited to relatively large displays wherein the character height is approximately 0.3 of an inch. Second, a larger light flux is required to maintain constant brightness over a larger surface area. A further constraint imposed by criteria 1 for Category A electroluminescent semiconductor displays is that the interior of the cavity should be formed of a specularly reflecting metal upon some underlying material. This is a very expensive process, particularly if the material deposited on the cavity walls is gold or silver.

Further, in spite of the expensive design, Category A prior art devices have not produced uniform light distribution at the upper surface of the display. These irregularities are usually discernable with the naked eye and detract substantially from the overall appearance of the display.

Prior art devices in Category B as shown in FIGS. 2A and 2B, have evolved along a slightly different design ideology. In Category B designs, a light source **12*b* which may be either a side-emitting or top-emitting electroluminescent semiconductor (typically gallium arsenide phosphide or gallium phosphide), is placed in a cavity 13*b* with reflective walls 24*b*. The cavity 13*b* is not filled with transparent material, but is merely covered with a randomly refracting surface 19*b*, for example, a fly's-eye lens as shown. Category B prior art devices typically utilize vertical walls 24*b*** with increased depth *d* of the cavity **13*b* in order to improve upon the resulting nonuniform output light flux. This change causes the light emitted from the device to make more reflections off the walls 24*b* but allows a nonisotropically emitting device 12*b*** such as gallium arsenide phosphide to be used.

Category B designs typically require the following four criteria:

1. A fly's-eye lens or other randomly refracting surface. This lense configuration is a substitute for the randomly refracting surface described in Category A prior art.

2. An air-filled cavity between the light emitting semiconductor device and the lens. Such a lens is typically used on the cavity side of the upper surface because, if used on the side from which the display is viewed, oil or water or other liquid contaminant can destroy the randomly refractive effect of the lens. The efficiency of such a lens is based upon the difference in refractive indices of the lens material and the material within the cavity. Thus, the cavity cannot be filled with plastic or other material without destroying the effectiveness of the lens. So air usually fills the cavity in Category B designs.

3. Specularly reflecting metalized cavity walls.

4. Vertical end walls and vertical side walls. Inwardly sloping side walls cannot be used for the same reasons as set forth in the discussion of Category A designs.

Category B devices have several other disadvantages. Typically, because they use more parts, they are more difficult and expensive to fabricate. Second, because of the air-filled cavity, they are not able to take advantage of the enhancement in coupling efficiency which results from embedding the light-emitting device in transparent plastic. This reduction in coupling efficiency occurs because of the difference in refractive indices between the air within the cavity and the electroluminescent semiconductor from which the light is emitted. Not filling the cavity with transparent plastic material reduces the efficiency of the light emitting diode substantially, that is, the light flux emitted directly into air is approximately lower by a factor of $n^2 \approx 2.5$ compared with the case of emission from chip to plastic without an air interface. ($n$ denotes the index of refraction of the plastic)

Devices designed utilizing Category B ideology also require plating the interior of the cavity as discussed under Category A designs. This greatly increases cost and complicates manufacture of the electroluminescent semiconductor displays. And, as discussed earlier, the display provided by Category B prior art design, is usually thicker than otherwise desirable in order to minimize the variation in light intensity at the upper surface of the cavity. The variations of light flux density between center and end is given by $\cos^n\alpha$ where n denotes a number equal or larger than 4 and $\alpha$ denotes the angle between two rays travelling to center and end, respectively. Thus it can be seen that variations in light flux density decreases with increasing cavity depth for a given cavity length. For all of the above reasons the uniformity of light distribution at the upper surface of Category B displays is not as good as that of Category A displays.

Summary of the Invention

In accordance with the present invention, the display apparatus includes a base, an electroluminescent semiconductor device, a body having optical passages therein of selected shape, and transparent filler material containing discrete light-scattering particles. Typically, the transparent filler is epoxy and the discrete particles are grains of powdered glass. Light emitted from the device travels through the filler material refracting at the particles within the filler and reflecting from the walls of the body until it leaves the display at the upper surface.

DESCRIPTION OF THE PREFERRED EMBODIMENT

Figure 3A:
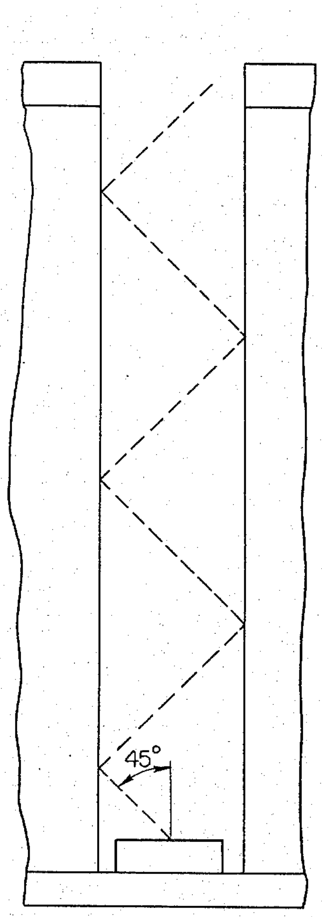
FIGS. 3A and 3B show the effect of converging side walls upon semiconductor displays utilizing specular reflection.
Figure 3B:
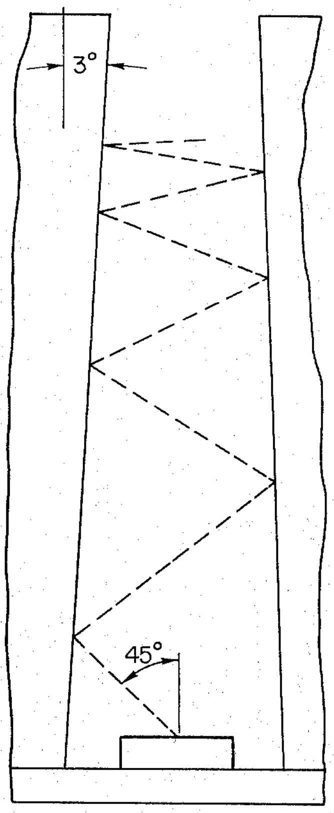

This invention is based on the principle of an integrating sphere. In an integrating sphere, light is reflected from a low-loss diffusely reflecting surface. After many random reflections it will strike an exit slot, which may have the shape of a single segment of a 7-segment numerical display. Such an integrating structure need not be of spherical shape, but may have any arbitrary shape consistent with low cost assembly of such a display. For two reasons a diffusely reflecting surface is preferred over a specularly reflecting surface. First, it avoids the problem already discussed in conjunction with FIG. 3B and second, it randomly refracts the light within the cavity before the light reaches the exit slot.

Figure 1A:
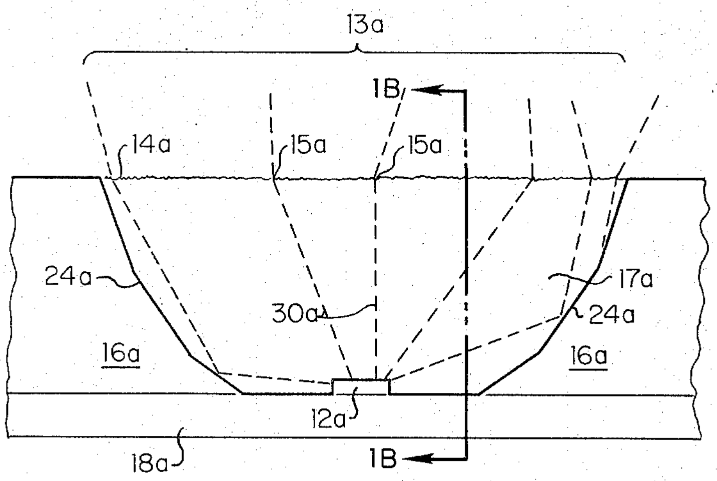
Figure 1A (PRIOR ART)
FIG. 1A shows the prior art and is a cross-section taken through the display.
Figure 1B:
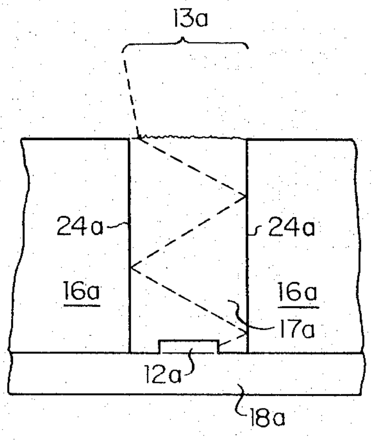
Figure 1B (PRIOR ART)
FIG. 1B is a second cross-section taken perpendicular to that of FIG. 1A.
Figure 2A:
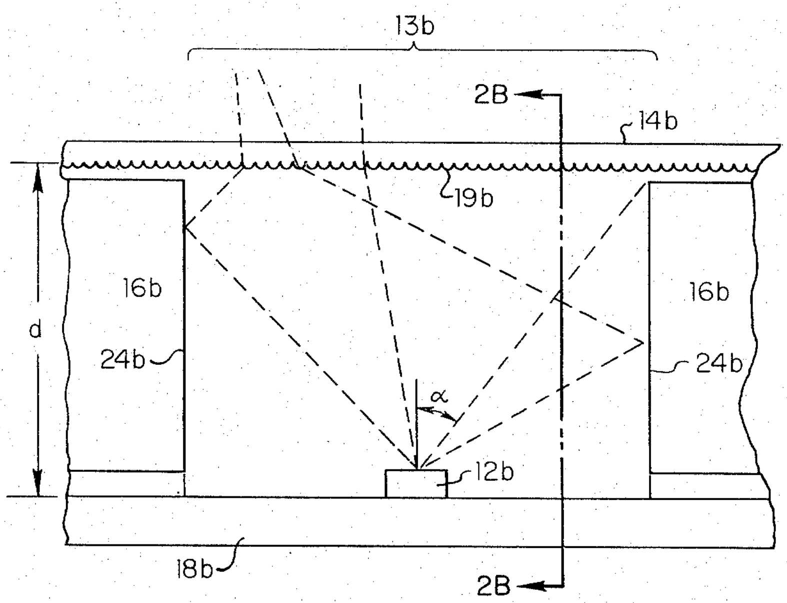
Figure 2A (PRIOR ART)
FIG. 2A shows the prior art and is a cross-section taken through the display.
Figure 2B:
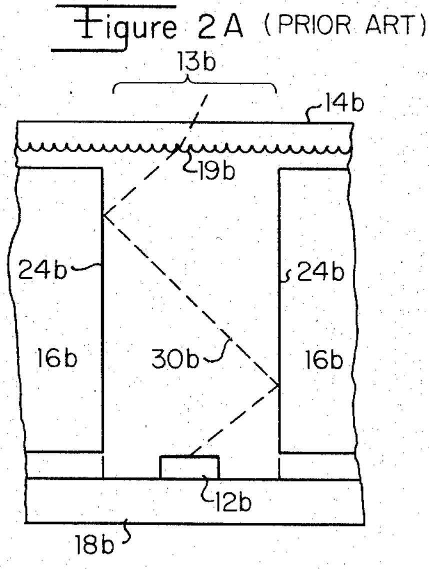
Figure 2B (PRIOR ART)
FIG. 2B is a second cross-section taken perpendicular to that of FIG. 2A.
Figure 4A:
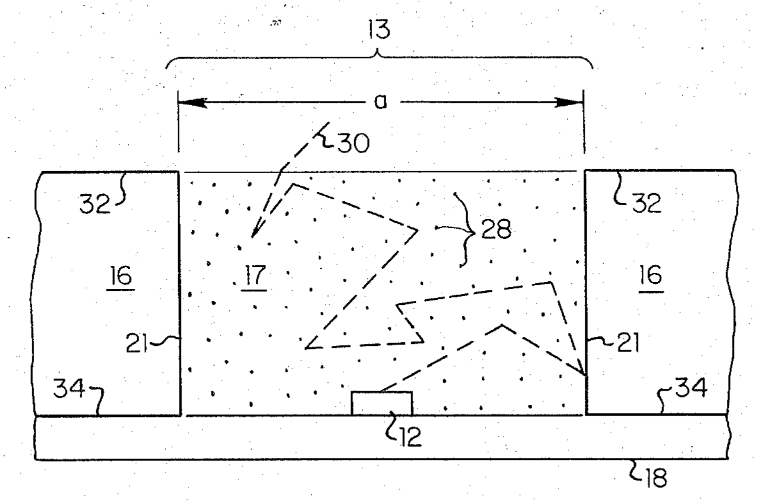
FIGS. 4A and 4B, FIGS. 5A and 5B, FIGS. 6A and 6B, and FIG. 7 show preferred embodiments of the invention.
Figure 4B:
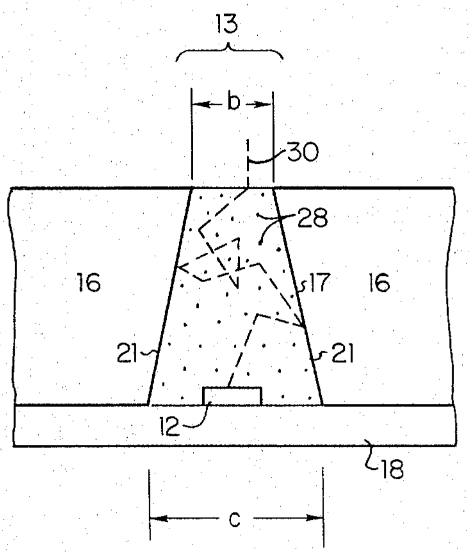

Referring now to FIGS. 4A and 4B, there is shown a preferred embodiment of the invention. An electroluminescent semiconductor 12 rests on a base 18, which may be any suitable material, e.g., ceramic. The light-emitting semiconductor 12 may be either top-emitting or side-emitting, typically either gallium arsenide phosphide or gallium phosphide. The semiconductor 12 is placed in a cavity 13 surrounded with a body 16. The cavity 13 is then filled with transparent material 17 containing scattering centers 28. The color of the surface of the body material 16 determines the amount of reflection which occurs at surface 24. White is preferred for this reason although it should be understood that a highly reflective color over the spectral range of the light emitted (e.g., red for red light, blue for blue light, etc.) may also be used. In the prior art both categories A and B utilized a specularly reflecting surface. This surface is typically achieved by deposition of a very thin layer of metal, typically gold, silver, copper or aluminum, upon the surface of the surrounding body 16. This is shown in FIG. 1 as surface 24*a* and in FIG. 2 as surface 24*b*. In contrast, utilization of diffuse reflection and of a body having white walls 21 in accordance with the present invention has several advantages over the prior art. The prior art devices are required to be plated with reflective material over the entire interior surface of the cavity. The costs of the material and of the plating process substantially increase the cost of such prior art devices over the present invention.

The present invention overcomes this drawback by utilizing diffusely reflecting plastic (for example, of white color) as opposed to a specularly reflecting surface. The effect of this choice may best be seen from the following calculations. The amount of light eventually emitted from a display device is proportional to $R^n$ where R is the reflectivity of the material and n is the numer of reflective or scattering events occurring.

In the case of the prior art devices, R is approximately 0.90. In other words, the metalized surfaces 24a and 24b in FIGS. 1 and 2 reflect approximately 90 percent of the light impinging upon them. The remaining 10 percent is absorbed.

In accordance with the present invention approximately 98.5 percent of the light which impinges upon the white surface 24 is reflected, a substantial advantage over the prior art. The light is bounced about the interior of the cavity 13 many times by the scattering centers 28 and by the white walls 21. Thus, the light 30 emitted is uniform in appearance over the length of the cavity 13 from one end to the other. For a given number of reflections, the emitted light 30 is more intense than that which would be emitted from a specularly reflecting design because the reflectivity of white walls is greater than the reflectivity of metalized walls. For example, if the light undergoes an average of 10 reflections from the metalized walls of the prior art devices before leaving through the exit slot, the R = 90 percent results in the total loss of 66 percent. In contrast, the white plastic walls of the present invention with R = 98.5 percent result in a loss of only 14 percent.

FIGS. 4A and 4B also show the path of a typical light ray 30 emanating from the electroluminescent semiconductor 12. It should be noted that this ray is provided only for the purposes of illustrating the effect of the scattering centers 28 and the white walls 24. To minimize the transfer of light from one cavity such as that in FIG. 4A to an adjoining cavity in some other portion of an overall display, surfaces 32 and 34 are blackened. Darkening surface 34 prevents the light emanating from electroluminescent semiconductor 12 from travelling between the base 18 and the body 16. Certain prior art devices interpose a separate plastic sheet between the body 16 and the substrate 18 (see FIG. 2) to prevent such light crossover. Darkening surface 32 absorbs light which is transmitted through body 16 and which strikes surface 32. If this surface is not darkened the difference in refractive indices between the air above the surface 32 and the material of body 16 causes almost total reflection back into body 16 of the light striking surface 32.

Figure 5A:
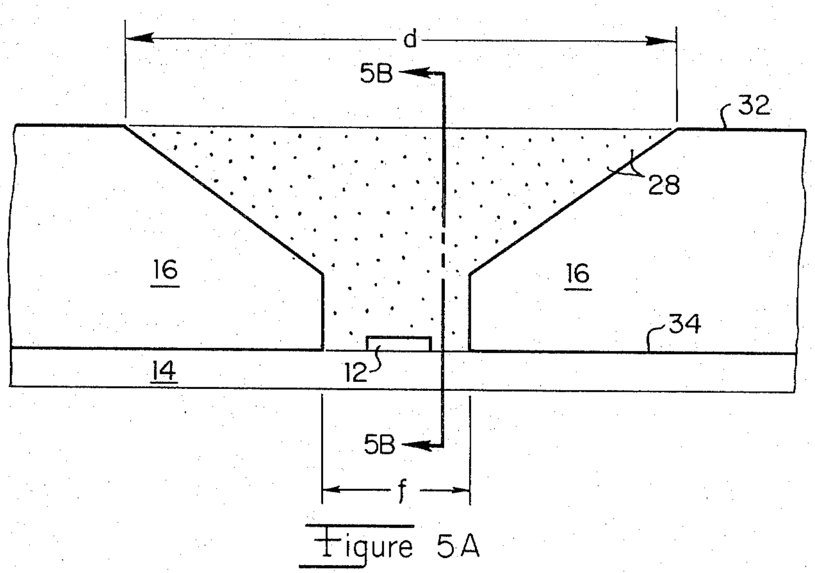
Figure 5B:
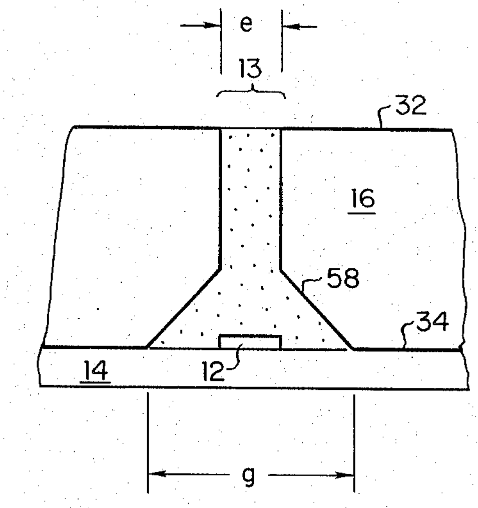

Another embodiment of the present invention is shown in FIGS. 5A and 5B. This embodiment may typically be used with displays wherein the height of the numeral or displayed numer is less than 0.3 inches. In these displays the assembly tolerances for placing the electroluminescent semiconductor 12 at the base of the cavity 13, before adding the transparent material 17 containing scattering centers 28 are very small, thus making it difficult to assemble properly. The cavity walls 58 may be cut away in the vicinity of the electroluminescent semiconductor 12 to facilitate assembly with acceptable tolerances.

Figure 6A:
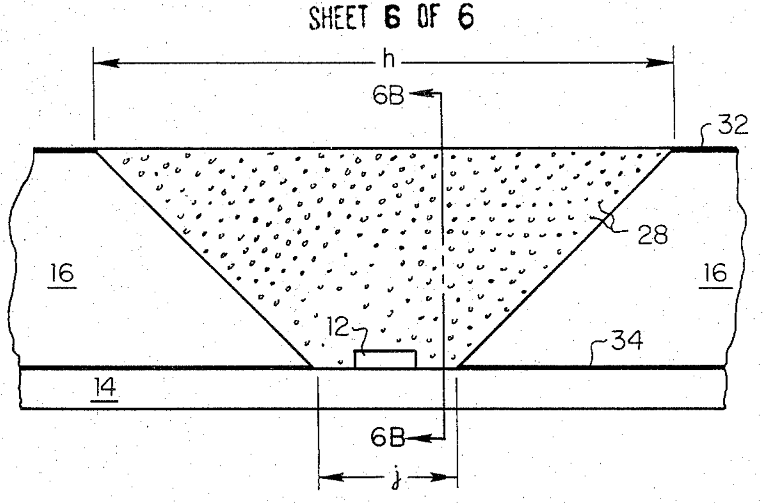
Figure 6B:
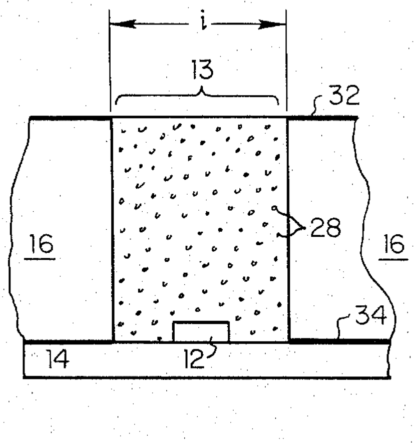
Figure 7:
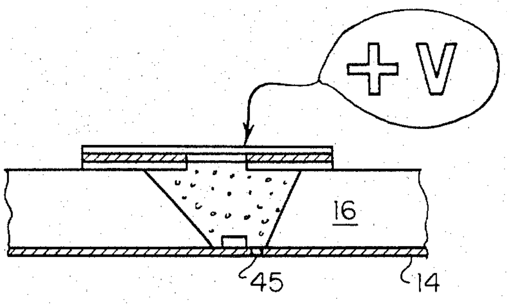

For larger character heights in which the size of the segment cavities are much larger, and consequently the assembly tolerances less constraining, a cavity shaped like that shown in FIGS. 6A and 6B may be used. This cavity shape has the advantage that the body may be molded in one operation from one side with concomitant savings in fabrication costs. Additionally, the shape of the upper region of the cavity may have any one of a number of selected shapes such as rectangles or other polygons quite independent of the shape of the cavity in the lower region. Thus, alphanumeric characters and symbols may be displayed with appropriate shaping of the upper region of the cavities. Where convenient, a single cavity may be employed prepared according to the present invention, with a separate legend plate 44 or aperture disposed over the upper surface as shown in FIG. 7. And the lower region of the cavity may have an arbitrary shape suitable for convenience fabrication, and may even include an opening 45 in the base 14 (with only negligible light loss therethrough) which opening may be the separation between electrodes of a stamped metal lead frame.

In the assembly process of the present invention, the body 16 may be cast to shape with the appropriately shaped cavity or cavities 13 included. The upper surface 32 (i.e., the output or viewing surface) may then be attached to a tape containing an adhesive for the purpose of sealing the upper cavity surfaces and facilitating the automated handling of the bodies 16. The tape and adhesive should be capable of withstanding elevated processing temperatures and not be reactive with the solvents, filler materials or plastics used. Commercially available Teflon-base tape including silicone-base pressure-sensitive adhesive (distributed at Type 60 Tape by Minnesota Mining and Manufacturing Company) is adequate for this purpose. The liquid filler material 17 (e.g., an epoxy resin) with the scattering centers 28 dispersed therein may then be introduced into the back side of the body to be distributed within the cavities and over the back surface of the body. In order to insure that the cavities are completely filled with the liquid filler material, the bodies with a quantity of liquid filler material therein may be positioned with viewing surface 32 disposed downwardly on swing-mounted platforms within a centrifuge in order to exert sufficient force upon the liquid filler material to exclude or displace entrapped air within the cavities 13 and thereby to assure complete filling of the cavities through the bodies from the back sides to the viewing surface 32. It has been determined that a minimum amount of force must be applied to the liquid filler material to force out the air bubbles entrapped within the cavity through the surface of the liquid filler material at the back side of the body 11. Thus, a force of at least 10 G must be exerted (for example, by centrifuging) substantially normal to and in the direction toward, the surface 32 with this surface firmly positioned on a swing-mounted platform of the centrifuge.

After the liquid filler material 17 has been completely distributed throughout the cavities and rear side of the body in this manner and while the filler material is still liquid, the base 18 may be inserted in place. This base 18 is typically a lead frame which includes the semiconductor light emitting devices attached thereto and which includes wire-bonded connections between the upper surface of the light-emitting devices and adjacent electrodes. This lead frame assembly may be urged down into place, slightly displacing sufficient filler material to assure complete filling of all voids and to encapsulate the entire assembly in the liquid filler material in the single operation. Thereafter, the body and lead frame, together with the liquid filler material disposed throughout may then be heat treated to cure the liquid filler material to a solid state. After the filler material is cured, the tape may be removed from the viewing surface 32, to yield the completed unit having the viewing apertures and the associated cavities substantially flush-filled to the level of the viewing surface 32.

In summary, the present electroluminescent display apparatus provides a display which has a substantially uniformly illuminated surface using an electroluminescent semiconductor light source which may be either top-emitting, side-emitting, or both.

The display may be formed of one or more cavities of selected shapes which are filled with epoxy and glass. This provides diffuse reflection which eliminates the necessity of deposition of metal on the walls surrounding the light-emitting semiconductor with concomitant savings in fabrication costs. Also, the preferred white color of the diffusely reflecting cavity walls absorbs less light than conventional specularly reflecting walls of deposited metal. The blackened upper and lower outer surfaces of the body surrounding the cavity reduce the transfer of light from one cavity of the display to an adjacent cavity of the display. In accordance with the processing of the present invention, no roughening of the upper surface of the material which fills the cavity is necessary. The material which fills the cavity may have an index of refraction close to that of the electroluminescent semiconductor for assuring efficient transfer of light out of the semiconductor.

In addition, the processing of the present invention provides for complete filling of the body and centrifuging of the filler material into all cavities of the body before the base or lead frame is introduced and before the entire assembly is heat treated to cure the liquid filler material. This greatly simplifies alignment and assembly of parts and facilitates the inexpensive mass production of solid state display devices.

I claim:

1. Electroluminescent semiconductor display apparatus comprising:

a base;

a body of material of selected thickness having upper and lower surfaces and having an opening passing through the body from said upper surface to said lower surface, said lower surface of the body being substantially contiguous with said base for forming a cavity within said opening which has a bottom formed by said base and has sides formed by walls of said opening, at least the sides of said cavity forming non-specularly reflective surfaces;

an electroluminescent semiconductor attached to the base at the bottom of the cavity;

optically transmissive material containing discrete particles for the scattering of light passing through said material, said material and discrete particles being disposed throughout the cavity; and means for supplying electrical signals to the electroluminescent semiconductor.

2. Apparatus as in claim 1 wherein at least the sides of said cavity are formed of substantially white optically opaque material.

3. Apparatus as in claim 1 wherein at least the upper surface of the body in the region surrounding the opening is substantially absorptively opaque for absorbing light leaving the cavity through the body.

4. Apparatus as in claim 3 wherein:

the shape of the opening at the upper surface of the body is a first polygon having at least one length $a$ and one width $b$;

the shape of the opening at the lower surface of the body is a second polygon having at least one length $a$ and one width $c$, where $c$ is not less than $b$; and the centroid of the first polygon lies approximately above the centroid of the second polygon.

5. Apparatus as in claim 3 wherein:

the shape of the opening at the upper surface of the body is a first rectangle of length $d$ and width $e$;

the shape of the opening at the lower surface of the body is a second rectangle of length $f$ and width $g$, where $f$ is less than $d$, and $g$ is greater than $e$;

the shape of the opening at a selected intermediate location between the upper surface of the body and the lower surface of the body is a third rectangle of length $f$ and width $e$;

the centroids of the first, second and third rectangles lie approximately on a straight line;

the four sides of the opening between the upper surface and the selected intermediate location are each planar; and the four sides of the opening between the lower surface and the selected intermediate location are each planar.

6. Apparatus as in claim 3 wherein the lower surface of the body in the region surrounding the opening is substantially absorptively opaque for absorbing light in the region of said lower surface.

7. The method of forming semiconductor display apparatus having a plurality of selectively shaped apertures forming illuminatable regions, the method comprising the steps of:

forming a body including the selectively shaped apertures, each of which traverses the thickness of the body from viewing surface through the body to a rear surface thereof;

filling the cavities of said body with a heat-curable, optically transparent liquid filler material having optical scattering centers dispersed therethrough;

embedding a light source in the liquid filler material within the aperture from the rear surface of the body; and curing said liquid filler material to a substantially solid state.

8. The method according to claim 7 wherein the steps of filling the apertures of the body include the additional steps of:

forming a liquid-impervious barrier across the aperture substantially flush with the viewing surface of the body;

exerting force on the liquid filler material to completely fill the apertures within the region between the viewing surface and the rear surface of said body; and introducing a light source and connections therefor into the liquid filler material near the rear side surface of the body in line with an aperture.

9. The method as in claim 8 wherein the step of exerting force on the liquid filler material includes the step of:

introducing centrifugal force on the liquid filler material aligned substantially normal to the viewing surface in a direction from the rear surface of the body toward the viewing surface of said body.

10. The method as in claim 9 wherein said step of exerting force includes:

introducing centrifugal force on the liquid filler material in excess of 10 G's.

* * * * *